United States Patent
Fernihough et al.

(10) Patent No.: US 7,169,242 B2
(45) Date of Patent: Jan. 30, 2007

(54) METHOD OF REMOVING CASTING DEFECTS

(75) Inventors: John Fernihough, Ennetbaden (CH); Matthias Hoebel, Windisch (CH); Maxim Konter, Klingnau (CH)

(73) Assignee: Alstom Technology Ltd., Baden (CH)

( * ) Notice: Subject to any disclaimer, the term of this patent is extended or adjusted under 35 U.S.C. 154(b) by 204 days.

(21) Appl. No.: 10/923,023

(22) Filed: Aug. 23, 2004

(65) Prior Publication Data

US 2005/0067065 A1    Mar. 31, 2005

Related U.S. Application Data

(63) Continuation of application No. PCT/IB03/00362, filed on Feb. 4, 2003.

(30) Foreign Application Priority Data

Feb. 27, 2002    (EP) .................................. 02405142

(51) Int. Cl.
    *B22D 27/20* (2006.01)
(52) U.S. Cl. ..................... 148/512; 148/538; 164/55.1; 164/125
(58) Field of Classification Search ................ 148/508, 148/512, 538; 164/55.1, 122, 125
    See application file for complete search history.

(56) References Cited

U.S. PATENT DOCUMENTS

| | | | |
|---|---|---|---|
| 3,310,423 A * | 3/1967 | Ingham, Jr. ................. | 427/456 |
| 3,690,367 A | 9/1972 | Daniels | |
| 4,705,203 A | 11/1987 | McComas et al. | |
| 4,714,101 A * | 12/1987 | Terkelsen ................. | 164/122.2 |
| 4,878,953 A | 11/1989 | Saltzman et al. | |
| 4,960,611 A | 10/1990 | Fujisawa et al. | |
| 4,969,501 A | 11/1990 | Brokloff et al. | |
| 5,167,734 A * | 12/1992 | Mueller et al. ............. | 148/675 |
| 5,193,272 A | 3/1993 | Wortmann et al. | |
| 5,312,584 A | 5/1994 | Frasier et al. | |
| 5,701,669 A | 12/1997 | Meier | |
| 5,837,960 A | 11/1998 | Lewis et al. | |
| 5,914,059 A | 6/1999 | Marcin, Jr. et al. | |
| 6,024,792 A | 2/2000 | Kurz et al. | |

(Continued)

FOREIGN PATENT DOCUMENTS

DE    199 49 972 C1    2/2001

(Continued)

OTHER PUBLICATIONS

Search Report from PCT/IB 03/00362 (Sep. 4, 2003).

(Continued)

*Primary Examiner*—George Wyszomierski
(74) *Attorney, Agent, or Firm*—Cermak & Kenealy, LLP; Adam J. Cermak

(57) ABSTRACT

A method for removing casting defects (5) from an article (1) with an oriented microstructure can include locating at least one casting defect (5) and melting the casting defect (5) locally by a heat source (7) to a depth at least as great as the casting defect (5) itself. The molten material can then be solidified epitaxially with respect to the surrounding oriented microstructure of the article (1) in a way that the resulting solidified area is substantially free of any defect.

20 Claims, 3 Drawing Sheets

U.S. PATENT DOCUMENTS

| | | | |
|---|---|---|---|
| 6,054,672 A | 4/2000 | Foster et al. | |
| 6,073,677 A * | 6/2000 | Backerud et al. | 164/4.1 |
| 6,084,196 A | 7/2000 | Flowers et al. | |
| 6,615,470 B2 * | 9/2003 | Corderman et al. | 29/402.13 |
| 2003/0037436 A1 * | 2/2003 | Ducotey et al. | 29/889.1 |

FOREIGN PATENT DOCUMENTS

| | | |
|---|---|---|
| EP | 0 558 870 A1 | 9/1993 |
| EP | 0 740 977 A1 | 11/1996 |
| EP | 0 749 790 A1 | 12/1996 |
| JP | 59152029 | 8/1984 |
| JP | 60167723 | 8/1985 |
| WO | 03/072284 A2 | 9/2003 |
| WO | 03/072284 A3 | 9/2003 |

OTHER PUBLICATIONS

Search Report from EP 02 40 5142 (Oct. 21, 2002).
IPER from PCT/IB03/00362 (Feb. 27, 2004).
Search Report from EP 92 81 0156 (Feb. 15, 1993).
"Figure 4.18 Schematic Summary of Single-Phase Solification Morphologies," Fundamentals of Solidification—Third Edition, 1989, (Kurz, W. and Fisher, D. J., eds.), Figure 4.18, Trans Tech Publications, Aedermannsdorf, Switzerland.

* cited by examiner

METHOD OF REMOVING CASTING DEFECTS

This application is a Continuation of, and claims priority under 35 U.S.C. § 120 to, International application number PCT/IB03/00362, filed 4 Feb. 2003, and claims priority under 35 U.S.C. § 119 to European application number 024 05 142.7, filed 27 Feb. 2002, the entireties of which are incorporated by reference herein.

BACKGROUND OF THE INVENTION

1. Field of the Invention

The invention relates to a method of removing casting defects in articles with oriented microstructure.

2. Brief Description of the Related Art

Single crystal and directionally solidified castings, such as turbine blades, are manufactured using a directional solidification process in which a ceramic shell mould filled with an alloy in the liquid state is withdrawn from a heating zone (temperature above the melting point of the alloy) into a cooling zone (well below the melting point of the alloy in temperature). This is known for example from the documents U.S. Pat. No. 4,96,501, U.S. Pat. No. 3,690,367 or EP-A1-0 749 790. As the shell mould is withdrawn, the liquid alloy solidifies directionally—beginning with that portion of the mould that enters the cooling zone first, and ending with the last portion of the mould to enter the cooling zone. During the solidification of the alloy, the solid/liquid interface is found substantially at a level between the heating and cooling zones. Those skilled in the art of investment casting and directional solidification are aware of the critical importance of maintaining the proper conditions at the solid/liquid interface. For example, too low of a thermal gradient across the solid/liquid interface, and/or too much of an incline of the interface compared to the horizontal, can result in the formation of freckles. Freckles are formed due to interdendritic fluid flow, resulting in chains of equiaxed grains surrounded by material rich in eutectic phases (overly rich in the elements which segregate to the liquid phase during segregation). The chains can be anywhere from 2 mm to 20 cm long, and constitute zones of unacceptable weakness (fatigue strength) in single crystal alloys due to the lack of grain boundary strengtheners. Freckles are also considered critical defects in columnar grain alloys, despite their higher content of grain boundary strengtheners. In other cases, new grains can nucleate and grow for a limited distance in the direction of growth of the solid/liquid interface, provided that the primary orientation (crystallographic orientation relative to the growth direction) is close to that of the rest of the casting. This defect is known as a sliver, and can reach lengths of 5 cm or more. Since it may comprise a high angle boundary which is almost always impossible to measure using Laue methods due to the limited width of the grain, slivers are also considered critical defects. Other grain related linear defects include low angle grain boundaries which are above the allowed limit of misorientation. Non grain related linear defects include linear chains of pores, surface micro-cracks and dross or inclusions which are normally only detectable using Fluorescent Penetrant Inspection (FPI). Another well known potential defect in single crystal and columnar-grained castings is recrystallized grains. Although these develop only during the solution heat treatment and/or reconditioning, repair, rejuvenation treatments, they can be considered casting defects since they are caused by excessive local deformation of the cast article due to the differential thermal contraction of the casting alloy, ceramic core and ceramic shell mold as the casting assembly cools. Recrystallized grains typically occur in the regions of highest deformation which are usually fillets, corners and design features which constrain the core or shell against the cast article.

Those skilled in the art of casting single crystal and columnar grained articles are aware of the economic significance of such linear defects. Part cost decreases substantially when more parts can be cast at the same time in one cluster. However, due to the increased mass of liquid alloy that must be cooled, and the decreased thermal radiation allowed per unit area of shell mould from a denser, heavier cluster to the cooling zone, clusters with more pieces naturally tend to exhibit lower thermal gradients and high inclinations of the solid/liquid interface than clusters with fewer pieces on them. Larger cluster sizes therefore are more freckle prone than clusters with fewer pieces. Even in small sized clusters of castings, freckles are a well known problem as it is desirable to pull castings as quickly as possible into the cold zone, but more rapid withdrawal also results in lower thermal gradients across the solid-liquid interface. Typically, it is industry standard for buyers of single crystal castings to reject some articles based on specifications limiting the acceptable sizes and locations of freckle defects on each casting. The rate of rejection can be anywhere from under 5% to over 50% depending on the alloy used and size of the article. The casting process parameters (including cluster size) are always developed in order to achieve a balance between production rate and the rate of rejection from casting defects to optimize overall process economics. Depending on the alloy chemistry (for example, alloys rich in Ti, Al, W and poor in Ta are more prone to freckles) the optimum process may still produce significant scrap from linear defects. So far no method has been disclosed to repair these defects, but such a method would significantly impact the economics of the columnar grained or single crystal casting process. Parts that are normally thrown away (only value is that of the alloy—about 10% or less of the part value) could be restored to full value for a fraction of the manufacturing cost.

One benefit that is sought after is a method to repair defects in single crystal or columnar grained articles to restore the full strength of the defect-free material without compromising the quality of the material. Until now, no method has been available to carry out such a repair operation. However, newly invented single crystal welding processes offer possibilities.

One such welding process is disclosed in U.S. Pat. No. 6,024,792 in which a powder or wire is fed into a laser beam (or other heat source) as it melts an existing single crystal structure. Another welding method is disclosed in U.S. Pat. No. 6,084,196 using plasma-transfer arc to deposit material into a damaged section of a single crystal article.

EP-A1-0 558 870 describes free form welding of metallic articles with a laser where already built-up material acts as a substrate for newly deposited metal. However, the authors either use powder or wire feed and pulsed laser irradiation. EP-A1-0 740 977 furthermore describes a containerless method of producing crack free metallic articles using a laser beam operating at moderate power density. A large diameter beam produces a shallow melt pool from which single crystal articles are generated by addition of powder. The relatively long interaction time is claimed to be advantageous to reduce the cracks resulting from hot tearing defects during solidification. The method, however, focuses on the generation of new parts. Also the process parameters are chosen in order to reduce thermal gradients and thus stress, which is not favourable for single crystal solidification.

A similar technique is described in U.S. Pat. No. 5,914,059 as a suitable method of repairing metallic articles by energy beam deposition with reduced power density. Again, the focus is on remelting filler material into defective regions of a single-crystal parts and on maintaining process conditions that reduce the cracking risk. The same intention is mentioned in U.S. Pat. No. 6,054,672 which describes laser welding of super alloy articles. Here the strategy is to reduce stress by preheating the entire weld area and the region adjacent to it to a ductile temperature above the ageing temperature but well below the melting temperature of the melting temperature of the super alloy.

U.S. Pat. No. 5,837,960 describes a computer aided laser manufacturing process which is used to generate articles by laser/powder techniques. Again, the addition of powder is an essential part of that invention. U.S. Pat. No. 5,312,584 describes a moldless/coreless method of producing single crystal castings of nickel-aluminides. In this case a laser is used to melt a Ni—Al target which melts, forms a drip and solidifies on an underlying single crystal substrate.

DE-C1-199 49 972 uses a laser method to generate 3D objects using a digitizer/optical vision system and layer by layer material build-up. The method requires additional material supply which is not necessary for the local repair of casting defects.

A method for remedying material defects is suggested in U.S. Pat. No. 4,960,611. Here, however, the laser is used to irradiate small coating defects which are caused by adhesion of dust particles, oil droplets or similar. The laser vaporizes the defects and creates a small cavity which is repaired by addition of filler material and subsequent curing with IR laser radiation.

SUMMARY OF THE INVENTION

One of the various aspects of the present invention is to provide a method for removing casting defects from an article with oriented microstructure in an easy and cost-effective manner while restoring a defect-free grain structure and microstructure to the article.

According to an aspect of the invention, a method was found of removing casting defects from an article with an oriented microstructure, the method can include:
  a) locating at least one casting defect,
  b) melting the casting defect locally by a heat source to a depth at least as great as the casting defect itself,
  c) solidifying the molten material epitaxially with respect to the surrounding oriented microstructure of the article substantially free of a casting defect.

One of the several advantages and features of this embodiment of the method is that it utilizes the material of the defect itself as the welding material. The defect comprises essentially identical material compared to the rest of the article, so melting and re-solidifying epitaxially into the oriented microstructure of the article results in a structure substantially identical to that of a cast article that never had defects in the first place. Where it is difficult to avoid the formation of a small surface layer of equiaxed grains during epitaxial solidification, it is still possible to re-melt the re-solidified portion of material again using a reduced energy density of the heat source compared to what was employed during the first melting operation, and again allowed to solidified epitaxially with the surrounding defect free microstructure.

During the step of melting the casting defect locally the heat source can be moved along the length of the casting defect. In addition, the molten material solidifies epitaxially with respect to the surrounding oriented microstructure of the article in a way that the solidified area is restored substantially to a volume as it was with the casting defect.

In some cases it is advantageous to prepare the cast article for the repair operation by stress relief heat treatments to temperatures close to the incipient melting point or first removing at least a portion of at least one defect in accordance with the principles of the invention.

As an example, a casting defect of one of the following can be re-melted: a freckle, a sliver, an equiaxed or recrystallized grain, a linear crack, a surface micro-crack, a chain of pores, a linear dross inclusion or a linear cluster of inclusions.

In one advantageous embodiment, additional material is added to the locally melted area during the welding operation, in order to compensate for the missing volume of the defect. In another embodiment, material is added before the melting operation in the form of a preform solid, powder compress, paste or slurry and used to fill at least a portion of the defect that was remelted. Additional material can also be added when no portion of any defect has been removed. This material can have substantially the same composition as the underlying article. In still one other embodiment the defect is melted and re-solidified, and then a second melting operation is carried out while this time adding additional material. After the solidification of the alloy, excess material is machined away e.g. by grinding. One embodiment of the invention is to remove a portion of the casting defect by machining before re-melting begins.

For a more precise determination of the locations of existing casting defects, a vision system can be used to record locations on a specific article when it is in the grain etched condition to reveal grain related defects such as freckles, slivers or small equiaxed grains or in Fluorescent Penetrant Inspection (FPI) to reveal linear cracks, chains of pores or linear dross/inclusions and then, again, later used to guide the heat source to these areas for melting the casting defect.

As heat source, the casting defect is locally melted by at least one laser or at least one of Plasma Transfer Arc Welding, Micro Plasma Welding, Tungsten Inert Gas Welding, and Electron Beam Welding. This can be done under an inert gas atmosphere, with inert gas shielding, or under vacuum. Larger penetration depths can be achieved by further reducing the processing speed or by preheating the article prior to the melting of the casting defect to a desired temperature in the range of 500–1000° C.

The methods are preferably applied to an article such as gas turbine components made from a nickel or cobalt base super alloy. These articles will be a single crystal (SX) or directionally solidified (DS) microstructure.

Still other objects, features, and attendant advantages of the present invention will become apparent to those skilled in the art from a reading of the following detailed description of embodiments constructed in accordance therewith, taken in conjunction with the accompanying drawings.

BRIEF DESCRIPTION OF THE DRAWINGS

Preferred embodiments of the invention, given only by way of example, are illustrated in the accompanying drawings, in which.

DETAILED DESCRIPTION OF PREFERRED EMBODIMENTS

Figure 1:
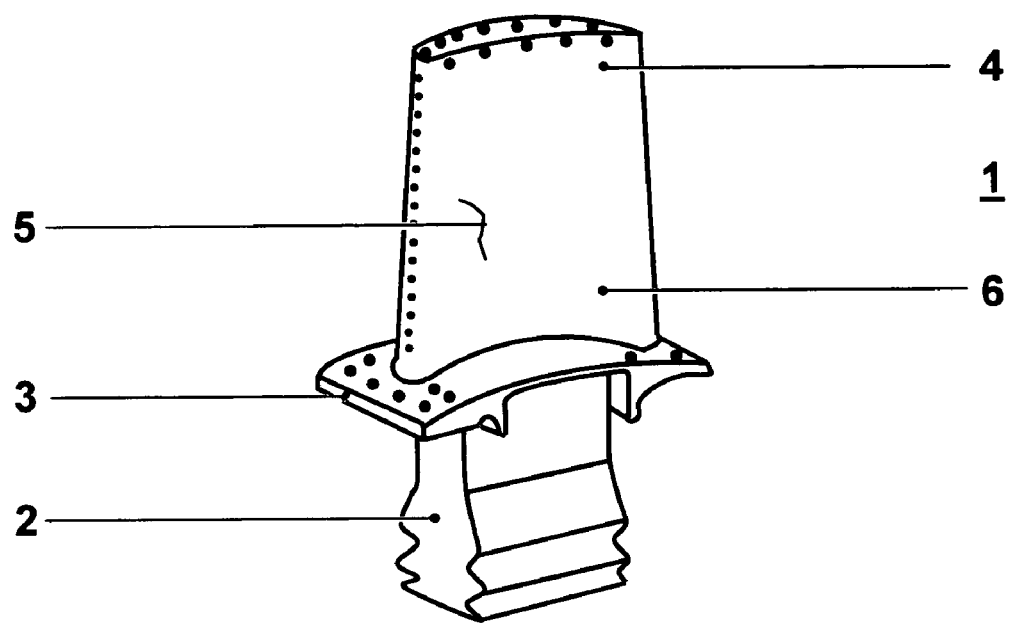
FIG. 1 shows a gas turbine blade having a casting defect.

Referring to the drawing figures, like reference numerals designate identical or corresponding elements throughout the several figures.

Figure 2:
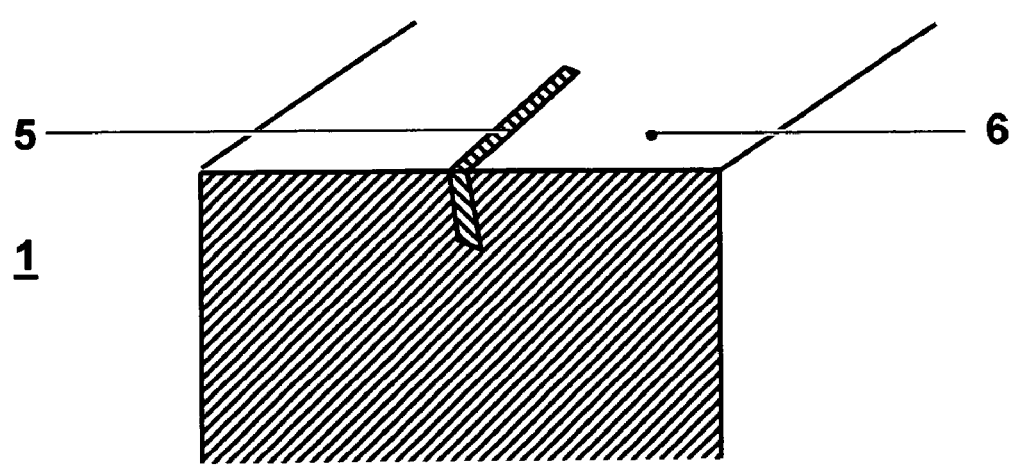
FIG. 2 shows an article prepared for a repair operation in accordance with the principles of the present invention.
Figure 3:
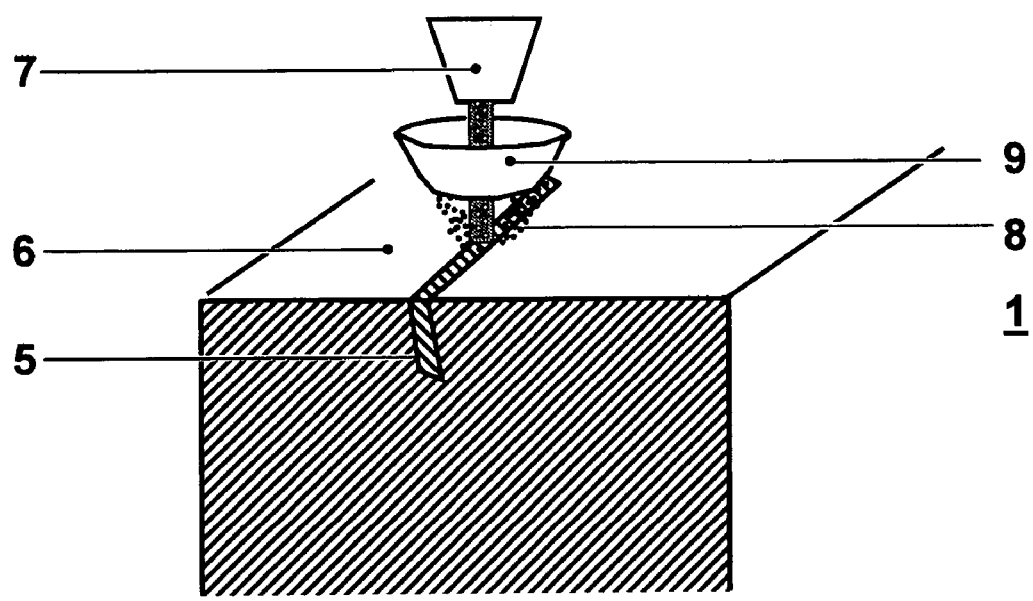
FIG. 3 shows an article undergoing a repair operation in accordance with the principles of the present invention.
Figure 4:
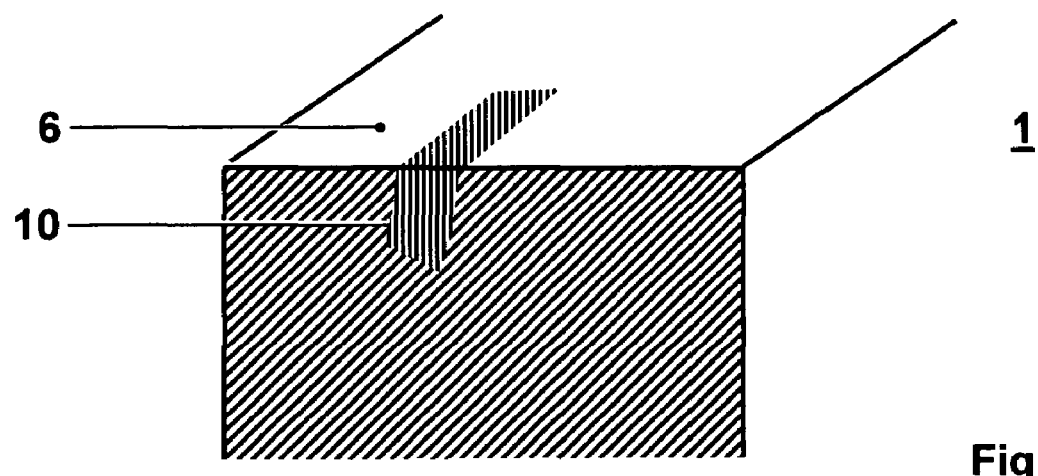
FIG. 4 shows an article treated in accordance with the principles of the present invention.

FIG. 1 shows a single crystal (SX) or directionally solidified (DS) article 1 such as blades or vanes of gas turbine engines, the gas turbine blade comprising a root portion 2, a platform 3 and a blade 4 and having a surface 6. The article can as an example be made from a nickel or cobalt based super alloy. Investment casting methods for producing such SX or DS articles are known e.g. from the prior art U.S. Pat. No. 4,96,501, U.S. Pat. No. 3,690,367 or EP-A1-0 749 790. As seen as well in FIG. 2, the article 1 exhibits a linear casting defect 5 such as a freckle, a sliver or any equiaxed or recrystallized grains of limited size somewhere after the production process. Non grain related linear defects include linear chains of pores, surface micro-cracks and dross or inclusions. FIGS. 3 and 4 show the different steps of removing the casting defect 5 according to an embodiment of the present invention.

In accordance with a preferred embodiment of the invention, at least one casting defect 5 is detected. Casting defects 5 are easily detected by using grain etching methods commonly known to those skilled in the art. Non grain related linear defects including linear chains of pores, surface micro-cracks and dross, inclusions or a linear cluster of inclusions are normally only detectable using Fluorescent Penetrant Inspection (FPI). After locating the casting defects 5, the extremities may be demarcated with scribe marks or other such visible means such that after polishing or abrasive cleaning the site of the casting defect 5 is still apparent. It is also possible to leave a light grain etch on the surface and use that to weld in the correct areas. In either case, a vision system may be used to assist in the welding process. The system may be used to first record the position of the casting defect 5 (no marks are required) in the grain etched state and then used to guide the source of heat later for the repair operation.

As seen in FIG. 3 the article 1 is melted from the surface 6 in the region of the casting defect 5 by the use of a locally acting heat source 7, e.g. a laser, to a depth at least as great as the casting defect 5 itself. The heat source 7 reheats the affected zone above the melting point. If during this operation the ratio $G^n/V_s$ (where G is the temperature gradient in the melt pool, n is a material constant and $V_s$ is the solidification speed) is kept above a material dependent threshold value, the subsequent solidification (as indicated in FIG. 4 with repaired zone 10) will occur epitaxially, i.e. without creating new grain boundaries. The surrounding single crystal bulk material will act as a crystal seed for the remolten material. After solidification the remolten material will have the same microstructure as the bulk material without any defect so that the oriented microstructure is substantially restored to a volume as it used to be with the casting defect 5. The casting defect 5 will be thus remedied.

It can be seen from the previous paragraph that high thermal gradients are crucial for single crystal solidification. For this reason lasers offer a particularly attractive choice for the heat source 7. Laser radiation can be focussed to small spots and generate thermal gradients in excess of $10^6$ K/m. It is beneficial if the laser intensity is uniform over the heated area, which can be achieved by fiberoptic beam delivery. As laser power is very easily controlled, it is ensured that the criterion for single crystal solidification is maintained during the whole repair operation. As an additional consequence the boundaries that have been set by the vision system do not have to be rigorously kept. If the heat source 7 acts on zones without casting defects 5 the material will be also remolten and it will subsequently resolidify with its original orientation. The melting of whole areas of limited size can as well be achieved by parallel, partially overlapping laser remelting tracks, for example when repairing clusters of freckles in close proximity, wide slivers, and shallow equiaxed grains. The overlap is typically 30%–50%.

In a typical application the laser will be focussed to a spot size of 1–2 mm diameter. Preferably the laser would be either of the Nd-YAG or high power diode laser type. These lasers operate in the near infrared and about 30–40% of the incident radiation is absorbed by typical super alloys. The laser beam will move at relatively slow speeds (approx. 1–10 mm/s) over the affected zones and operate in the conduction welding mode. Laser intensities of $1*10^3$ W/cm$^2$ to $5*10^4$ W/cm$^2$ will remelt a zone reaching up to 500 µm below the surface. Larger penetration depths can be achieved by further reducing the processing speed or by preheating the article 1 prior to the melting of the casting defect 5 to a desired temperature in the range of 500–1000° C., e.g. with a high frequency generator. On preheated articles, however, thermal gradients are smaller and it is more difficult to meet the $G^n/V_s$ criterion. On the other hand the risk of hot tearing defects during the repair operation is reduced.

It is known to those skilled in the art that under certain conditions it is difficult to avoid the formation of a small surface layer of equiaxed grains during the epitaxial solidification of such a weldment, due to failing to meet the $G^n/V_s$ criteria locally at the upper extremities of the weld pool. This is particularly true when the desired depth of welding is large, requiring a high local heat input. In these cases, it is very helpful to make a second pass after solidification with the heat source producing a lower energy density of heat input into the melt pool, yielding a shallower melting profile which further reduces the fraction of material that solidifies equiaxed. If a second pass is undesirable, the equiaxed grains can be ground or machined off. In this case, it is helpful to add material to the melt pool either before or during melting, so that the portion of the equiaxed solidification falls in the upper regions of excess material in the weld zone, and will be machined off during the removal of excess material to restore the originally intended dimensional profile to the cast article.

As heat source 7 at least one of Plasma Transfer Arc Welding, Micro Plasma Welding, Tungsten Inert Gas Welding, Electron Beam Welding are any other suitable tool can be used. The welding can be carried out under an inert gas atmosphere, with inert gas shielding, or under vacuum to prevent excessive oxidation of the liquid alloy. Furthermore, the article can be prepared before the melting of the casting defects by stress relief heat treatments to temperatures close to the incipient melting point.

After the repair, the normal heat treatments of solutioning and gamma prime coarsening may be carried out, but there may be an additional stress relief heat treatment prior to this to reduce the chances of recrystallization.

Optionally, as seen in FIG. 3, additional material 8 can be added to the already molten area by means of a feeder 9 to ensure the monocrystalline structure of the underlying material. In FIG. 3 coaxial injection is shown, which is favourable due its inherent axial symmetry. In another embodiment, material is added before the melting operation in the form of a preform solid, powder compress, paste or slurry and used to fill at least a portion of the defect that was remelted. Additional material can also be added when no portion of any defect has been removed. With advantage, additional material 8 with substantially the same composition as the article itself is fed to the locally melted area The defect comprises essentially identical material compared to the rest of the article, so melting and re-solidifying epitaxially into the oriented microstructure of the article results in a structure substantially identical to that of a cast article that never had defects in the first place. In another embodiment of a method according to the invention, the casting defect 5 is melted and re-solidified. Subsequently a second melting operation is carried out while this time additional material is injected to the melt pool. In case when excess material remains on the surface 6 after the solidification, this material will be machined away e.g. by machining or grinding. Still it is possible to remove by machining a portion of the casting defect before the method begins with the step of re-melting.

Example of Product Treated by a Method Embodiment of the Invention

Figure 5:
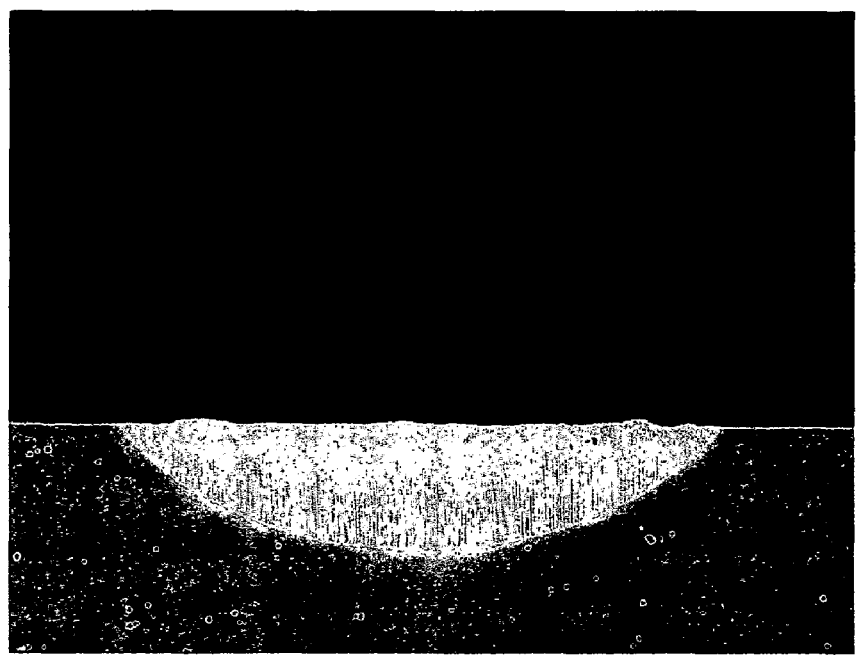
FIG. 5 shows an example of an article with a re-melted surface layer.

As shown in FIG. 5, a re-melting track on a SX-substrate (CMSX-4) can have a remelting depth of 0.40 mm. The matched orientation of the (fine) dendrites in the remolten area can be seen. Laser parameters were: P=320 W, v=8 mm/s, spot diameter: 2.0 mm.

REFERENCE NUMBERS

1 Article, e.g. blades or vanes for gas turbines
2 Root portion
3 Platform
4 Blade
5 Casting defect
6 Surface of article 1
7 Heat source
8 Additional material
9 Feeder
10 Repaired zone While the invention has been described in detail with reference to preferred embodiments thereof, it will be apparent to one skilled in the art that various changes can be made, and equivalents employed, without departing from the scope of the invention. Each of the aforementioned documents is incorporated by reference herein in its entirety.

What is claimed is:

1. A method of removing a casting defect which is not usually visible on the casting without the aid of grain etching or fluorescent penetrant inspection from a single crystal or directionally solidified article with an oriented microstructure, comprising:
    locating at least one casting defect by applying a grain etch and/or fluorescent penetrant inspection technique to the article;
    melting the casting defect locally by a heat source to a depth at least as great as the casting defect itself; and
    solidifying the molten material epitaxially with respect to the surrounding oriented microstructure of the article that is substantially free of a casting defect whereby the ratio $G^n/V_s$ (with G=temperature gradient at the melting point, n=material constant and $V_s$=solidification speed) is kept above a material dependent threshold value.

2. The method of claim 1, wherein during melting, the casting defect is locally melted along the length of the casting defect by moving the heat source.

3. The method of claim 1, further comprising:
    re-melting the solidified portion of the material using a reduced energy density of the heat source as compared to the energy density employed during the first melting; and
    solidifying the re-melted material epitaxially with respect to adjacent defect free microstructure.

4. The method of claim 1, wherein the molten material solidifies epitaxially with respect to the surrounding oriented micro structure of the article in a way that the solidified area is restored substantially to a volume equal to the volume of the area when it included the casting defect.

5. The method of claim 1, further comprising:
    preparing the article for a repair operation after locating the at least one casting defect.

6. The method of claim 1, wherein the at least one casting defect includes at least one of the following: a freckle, a sliver, an equiaxed grain, a recrystallized grain, a linear crack, a surface micro-crack, a chain of pores, a linear dross inclusion, and a linear cluster of inclusions.

7. The method of claim 1, further comprising:
    removing a portion of the casting defect by machining before solidifying begins.

8. The method of claim 1, further comprising:
    adding additional material before melting or to the locally melted area during or after melting.

9. The method of claim 8, wherein the additional material added before melting includes one of a preform solid, a powder compress, a paste, and a slurry.

10. The method of claim 8, wherein the additional material added to the locally melted area includes substantially the same composition as the article.

11. The method of claim 8, further comprising:
    machining excess material away after solidification of the molten material.

12. The method of claim 1, further comprising:
    melting a portion of the solidified material a second time while this time adding additional material.

13. The method of claim 12, further comprising:
    machining excess material away after solidification of the molten material.

14. The method of claim 1, further comprising:
    using a vision system to locate the at least one casting defect and to guide the heat source for melting the at least one casting defect.

15. The method of claim 1, further comprising:
    pre-heating the article to a temperature in the range of 500–1000° C. prior to the melting of the casting defect.

16. The method of claim 1, wherein melting includes using at least one laser as the heat source to locally melt the casting defect.

17. The method of claim 16, wherein the melting of the casting defect is carried out under an inert gas atmosphere, with inert gas shielding, or under vacuum.

18. The method of claim 1, wherein the heat source used in melting includes at least one of Plasma Transfer Arc, Micro Plasma, Tungsten Inert Gas, and Electron Beam.

19. The method of claim 18, wherein the melting of the casting defect is carried out under an inert gas atmosphere, with inert gas shielding, or under vacuum.

20. The method according to claim 1, wherein the article is a gas turbine component made from a nickel or cobalt base super alloy.

* * * * *